(12) United States Patent
Shibata et al.

(10) Patent No.: US 9,520,175 B2
(45) Date of Patent: Dec. 13, 2016

(54) MAGNETIZATION CONTROLLING ELEMENT USING MAGNETOELECTRIC EFFECT

(71) Applicant: TDK CORPORATION, Tokyo (JP)

(72) Inventors: Tatsuo Shibata, Tokyo (JP); Masashi Sahashi, Natori (JP)

(73) Assignee: TDK Corporation, Tokyo (JP)

( * ) Notice: Subject to any disclaimer, the term of this patent is extended or adjusted under 35 U.S.C. 154(b) by 1 day.

(21) Appl. No.: 14/532,533

(22) Filed: Nov. 4, 2014

(65) Prior Publication Data

US 2015/0123755 A1    May 7, 2015

Related U.S. Application Data

(60) Provisional application No. 61/900,091, filed on Nov. 5, 2013.

(51) Int. Cl.
*G11B 5/02* (2006.01)
*G11C 11/16* (2006.01)
(Continued)

(52) U.S. Cl.
CPC ............. *G11C 11/1677* (2013.01); *G11B 5/02* (2013.01); *G11B 5/65* (2013.01); *G11B 5/66* (2013.01);
(Continued)

(58) Field of Classification Search
None
See application file for complete search history.

(56) References Cited

U.S. PATENT DOCUMENTS 5,691,865 A    11/1997 Johnson et al.
5,768,065 A    6/1998 Ito et al.
(Continued)

FOREIGN PATENT DOCUMENTS

JP    A-2001-196661    7/2001
JP    A-2004-342183    12/2004
(Continued)

OTHER PUBLICATIONS

Xi He et al.; Robust isothermal electric control of exchange bias at room temperature; Nature Materials; p. 579-585; vol. 9.
(Continued)

*Primary Examiner* — Brian Butcher
(74) *Attorney, Agent, or Firm* — Oliff PLC (57) ABSTRACT

A magnetization controlling element includes a ferromagnetic material layer, an exchange coupling adjustment layer, an antiferromagnetic material layer, an electrode layer, a magnetic field applying mechanism which applies a magnetic field to the antiferromagnetic material layer, and an electric field applying mechanism which applies an electric field to the antiferromagnetic material layer. The antiferromagnetic material layer contains an antiferromagnetic material or ferrimagnetic material having a magnetoelectric effect, the ferromagnetic material layer includes a perpendicular magnetization film having a magnetization component perpendicular to the film surface, the ferromagnetic material layer includes a ferromagnetic material layer that is magnetically connected, through exchange coupling, to the antiferromagnetic material layer. The exchange coupling adjustment layer has a function of adjusting exchange coupling between the ferromagnetic material layer and the antiferromagnetic material layer.

5 Claims, 7 Drawing Sheets

(51) Int. Cl.
*G11B 5/65* (2006.01)
*G11B 5/66* (2006.01)
*G11C 11/15* (2006.01)
*H01F 10/32* (2006.01)
*G11B 5/012* (2006.01)

(52) U.S. Cl.
CPC .............. *G11C 11/15* (2013.01); *G11C 11/161* (2013.01); *G11C 11/1675* (2013.01); *H01F 10/3218* (2013.01); *H01F 10/3286* (2013.01); *G11B 5/012* (2013.01); *H01F 10/3272* (2013.01)

(56) References Cited

U.S. PATENT DOCUMENTS

| | | |
|---|---|---|
| 6,480,412 B1 | 11/2002 | Bessho et al. |
| 7,123,451 B2 | 10/2006 | Sbiaa et al. |
| 7,190,559 B2 | 3/2007 | Kagami et al. |
| 7,440,229 B2 | 10/2008 | Sasaki et al. |
| 7,580,222 B2 | 8/2009 | Sasaki et al. |
| 7,679,860 B2 | 3/2010 | Kudo et al. |
| 7,706,103 B2 | 4/2010 | Seigler |
| 7,716,812 B2 | 5/2010 | Kato et al. |
| 7,718,218 B2 | 5/2010 | Sasaki et al. |
| 7,719,883 B2 | 5/2010 | Hochstrat et al. |
| 8,284,527 B2 | 10/2012 | Yoshida et al. |
| 8,724,434 B2 | 5/2014 | Matsuzaki et al. |
| 2004/0228024 A1 | 11/2004 | Ogawa et al. |
| 2005/0141137 A1 | 6/2005 | Okada et al. |
| 2006/0114606 A1 | 6/2006 | Ide et al. |
| 2007/0230006 A1 | 10/2007 | Takahashi et al. |
| 2007/0230007 A1 | 10/2007 | Takahashi et al. |
| 2010/0103553 A1 | 4/2010 | Shimazawa et al. |
| 2010/0128377 A1 | 5/2010 | Zhou et al. |
| 2011/0049659 A1 | 3/2011 | Suzuki et al. |
| 2013/0279309 A1 | 10/2013 | Matsuzaki et al. |
| 2013/0335847 A1* | 12/2013 | Shiroishi ............ G11B 5/02 360/46 |

FOREIGN PATENT DOCUMENTS

| | | |
|---|---|---|
| JP | A-2007-265512 | 10/2007 |
| WO | WO 95/22820 A1 | 8/1995 |
| WO | WO 2009/133650 A1 | 5/2009 |

OTHER PUBLICATIONS

Pavel Borisov et al.; Magnetoelectric Switching of Exchange Bias; Physical Review Letters; p. 117203-1-117203-4; vol. 94; American Physical Society.
T. J. Martin and J. C. Anderson, IEEE Transactions on Magnetics, Antiferromagnetic Domain Switching in $Cr_2O_3$, vol. MAG-2, No. 3, p. 466, 447, 448, and 449.
I. E. Dzyaloshinski et al.; J. Exptl. Theoret Phys. (U.S.S.R.) 37, On the Magneto-Electrical Effect in Antiferromagnets, p. 628 and 629.
D. Chiba et al.; Magnetization vector manipulation by electric fields, Nature; p. 515-518, vol. 455; Macmillan Publishers Limited.
Yoichi Shiota et al.; Induction of coherent magnetization switching in a few atomic layers of FeCo using voltage pulses; Nature Materials; p. 39-43; vol. 11; Macmillan Publishers Limited.
Wolfgang Kleemann; Switching magnetism with electric fields; Physics 2; vol. 105; American Physical Society.
Xi Chen et al.; Magnetoelectric exchange bias systems in spintronics; Applied Physics Letters; 2006; article No. 202508; vol. 89; issue 20.
Ning Wu et al.; Imaging and Control of Surface Magnetization Domains in a Magnetoelectric Antiferromagnet; Physical Review Letters; p. 087202-1-087202-4; vol. 106; American Physical Society.
Ch. Binek et al.; Perpendicular exchange bias and its control by magnetic, stress and electric fields; The European Physical Journal B; p. 197-201; vol. 45; Springer.
W. Kleemann et al.; Magnetoelectricity in multiferroically composed multilayers and multiglasses; Journal of Magnetism and Magnetic Materials; p. 1785-1789; vol. 321; Elsevier.
Y. Shiratsuchi et al.; Interface Magnetism of Au/Co/$Cr_2O_3$ (0001) Epitaxial Film With Perpendicular Magnetic Anisotropy and Perpendicular Exchange Bias; IEEE Transactions on Magnetics; p. 1618-1621; vol. 46; IEEE Magnetics Society.
Y. Shiratsuchi et al.; Effect of crystallinity of Co layer on perpendicular exchange bias in Au-capped ultrathin Co film on $Cr_2O_3$(0001) thin film; Journal of Magnetism and Magnetic Materials; p. 579-586; vol. 323; Elsevier.
Y. Shiratsuchi et al.; Control of the Interfacial Exchange Coupling Energy in Pt/Co/a-$Cr_2O_3$ Films by Inserting a Pt Spacer Layer at the Co/a-$Cr_2O_3$ Interface; IEEE Transactions on Magnetics; p. 3909-3912; vol. 47; IEEE Magnetics Society.
Keith D. Bird et al, "Giant Magnetoresistance in Electrodeposited Ni/Cu and Co/Cu Multilayers," J. Electrochem. Soc., vol. 142, No. 4, Apr. 1995, pp. L65-L66.

* cited by examiner

MAGNETIZATION CONTROLLING ELEMENT USING MAGNETOELECTRIC EFFECT

BACKGROUND OF THE INVENTION

Along with the information explosion accompanying the development of computer networks, in particular, expansion of applications for large-scale data centers to meet the needs of cloud computing, there have been strong demands for higher capacity and power saving of memory and storage.

Spintronic technology has been under research and development as the next-generation technology that can achieve both high-capacity recording and power saving operation. At the core of the technology are magnetic recording devices, such as hard disks or magnetic memory devices (MRAMs), that use reversal of magnetic poles (N/S) for recording. In such technology, miniaturization and higher capacity have been achieved by techniques which are extensions of a technique of manipulating magnetic poles by externally applying a magnetic field. However, these techniques are approaching a technological limit, and there have been demands for establishing a manipulation technique based on a new principle. An electric field-induced magnetization switching technique in which magnetic poles are reversed by switching an electric field is anticipated for application as an ultimate energy-saving manipulation technique in which joule losses can be substantially ignored.

In recent years, a magnetoelectric effect (hereinafter, referred to as the "ME effect"), which is a cross correlation of electricity and magnetism, has been receiving attention as a technique capable of controlling magnetism by an electric field. Non-Patent Document 1 (H. Xe et al., Nature Materials, 9, 579(2010)) discloses a technique in which by applying an electric field and a magnetic field in a superimposed manner, exchange coupling generated at the joint interface between a ferromagnetic material and an antiferromagnetic material having an ME effect is modulated, and thus magnetic properties of the ferromagnetic material are manipulated. Xe et al. shows that magnetic properties of the ferromagnetic material can be changed only by switching the applying direction of an electric field. Patent Document 1 (U.S. Pat. No. 7,719,883) discloses a device, such as a so-called MRAM, in which two different resistive states are achieved in a magnetoresistive effect element, such as a spin valve or a TMR element, using the ME effect. Patent Document 2 (U.S. Pat. No. 8,724,434) discloses a technique of an ME recording system in which the ME effect is used for high-capacity magnetic recording, such as that in a hard disk.

In order to apply the ME effect in a hard disk or a magnetic recording device, such as an MRAM, it is required to achieve a state in which magnetic poles, i.e., the N pole and the S pole, are fully reversed. For this purpose, it is required to set the magnitude of exchange coupling generated at the interface (which is actually observed as exchange bias ($H_{EX}$)) to be larger than the value of coercive force ($H_C$) of the ferromagnetic material. On the other hand, when the value of exchange coupling generated at the interface is excessively large, the amount of energy required for the ME effect increases excessively, which is a problem. In order to use the ME effect for magnetic recording, a technique is required in which the magnitude of coercive force and the magnitude of exchange coupling are appropriately adjusted.

Non-Patent Document 1 and Non-Patent Document 2 (P. Borisov et al., Phys. Rev. Lett. 94, 117203(2005)) disclose a structure in which the magnitude of exchange coupling can be adjusted. In these documents, the authors disclose a structure in which Pt, Pd, or the like is inserted at the interface between an antiferromagnetic layer having the ME effect and a ferromagnetic material layer. However, in this structure, in the temperature range in which ME manipulation is possible, the magnitude of coercive force is larger than the magnitude of exchange coupling. As a result, although the exchange coupling can be changed, the magnetic poles of the ferromagnetic layer are not reversed.

SUMMARY OF THE INVENTION

The present inventors have clarified the following points:
(1) The layer having the ME effect preferably has a multilayer structure. The term "multilayer structure" means a lamination structure including a first ME recording layer containing mainly an antiferromagnetic material having the ME effect and a second ME recording layer containing mainly a ferromagnetic material. The first ME recording layer may contain not only an antiferromagnetic material having the ME effect, but also a ferrimagnetic material having the ME effect. Note, in the present invention, properties of the antiferromagnetic material and the ferrimagnetic material are close to each other when the two are distinguished by the way of array of spins, so the ferrimagnetic material having the ME effect is considered as one type of the antiferromagnetic material.
(2) The second ME recording layer is provided in the vicinity of the first ME recording layer. The term "vicinity" refers to a state in which the second ME recording layer is located close to the first ME recording layer to such an extent that the second ME recording layer can receive exchange bias ($H_{EX}$) from the first ME recording layer. The "exchange bias" can be controlled by applying a magnetic field and an electric field in a superimposed manner to the first ME recording layer. Data of the spin array recorded in the first ME recording layer is transferred to the second ME recording layer by the exchange bias. As a result, magnetization with a magnitude that can be used for magnetic recording is generated in the second ME recording layer.
(3) A novel mechanism is needed, which is capable of generating magnetization with a magnitude that can be used for magnetic recording in the second ME recording layer, even when an exchange bias ($H_{EX}$) provided by the first ME recording layer is small. For the magnetization of the second ME recording layer, the coercive force ($H_C$) of the second ME recording layer must be smaller than the exchange bias provided by the first ME recording layer. If the coercive force ($H_C$) of the second ME recording layer is large, the exchange bias required for the magnetization of the second ME recording layer also increases. However, if the exchange bias is large, the product of electric field and magnetic field (E×H) required for manipulation also increases. As a result, the required electric field (E) increases to such an extent that dielectric breakdown occurs in the first ME recording layer.

The present invention discloses a structure in which an exchange coupling adjustment layer is introduced as a novel layer having an ME effect. The exchange coupling adjustment layer is provided between a first ME recording layer having an ME effect (antiferromagnetic material layer and/or ferrimagnetic material layer) and a second ME recording layer (ferromagnetic material layer). The exchange coupling adjustment layer has a function of adjusting exchange coupling between the first ME recording layer and the second ME recording layer. The exchange coupling adjustment layer contains mainly at least one element selected from the group consisting of transition metal elements excluding ferromagnetic metals, light metal elements, and semiconductor elements, whose atomic number is 45 or lower. By using the exchange coupling adjustment layer containing mainly these elements, the magnitude of exchange coupling between the first ME recording layer and the second ME recording layer can be adjusted, without increasing the value of coercive force of the second ME recording layer containing mainly a ferromagnetic material, or while keeping the value of coercive force of the second ME recording layer low. As a result, it becomes possible to satisfy the relationship $H_{EX}>H_C$, even in the state where the exchange bias is small. Consequently, the exchange coupling adjustment layer generates magnetization with a magnitude that can be used for magnetic recording in the second ME recording layer, even when the magnitude of the exchange bias ($H_{EX}$) of the second ME recording layer is adjusted.

A novel magnetization controlling element in which an exchange coupling adjustment layer is introduced according to the present invention has the following structure:

(1) A novel magnetization controlling element includes a first ME recording layer (antiferromagnetic material layer and/or ferrimagnetic material layer) having an ME effect, a second ME recording layer (ferromagnetic material layer), a third ME recording layer (exchange coupling adjustment layer) having a function of adjusting exchange coupling, an electrode layer, a magnetic field applying mechanism, and an electric field applying mechanism. The second ME recording layer, the third ME recording layer, the first ME recording layer having the ME effect, and the electrode layer are disposed in that order.

(2) The magnetic field applying mechanism included in the novel magnetization controlling element applies a magnetic field to the first ME recording layer. The electric field applying mechanism included in the novel magnetization controlling element applies an electric field to the first ME recording layer.

(3) The first ME recording layer included in the novel magnetization controlling element contains an antiferromagnetic material or ferrimagnetic material having the ME effect, and thus functions as a layer having antiferromagnetism.

(4) The second ME recording layer included in the novel magnetization controlling element functions as a layer having ferromagnetism. The second ME recording layer contains a ferromagnetic material having a magnetization component perpendicular to the film surface and a ferromagnetic material that is magnetically connected, through exchange coupling, to the first ME recording layer which is an antiferromagnetic material layer.

(5) The third ME recording layer has a function of adjusting exchange coupling between the second ME recording layer and the first ME recording layer. The third ME recording layer contains at least one element selected from the group consisting of transition metal elements excluding ferromagnetic metals, light metal elements, and semiconductor elements, whose atomic number is 45 or lower.

BRIEF DESCRIPTION OF THE DRAWINGS

Table 1 shows the rate of magnetization reversal and the presence or absence of dielectric breakdown for samples with or without a third ME recording layer 103 in Example 3 of the present invention.

DESCRIPTION OF THE PREFERRED EMBODIMENTS

The embodiments of the present invention will be described below with reference to the drawings. It is to be noted that the following description shows merely some embodiments of the present invention, and the present invention is not limited to the embodiments. As long as embodiments embody the technical idea of the present invention, such embodiments are within the scope of the present invention. The structures in the embodiments and combinations thereof are merely examples, and additions, omissions, substitutions, and other modifications can be made without departing from the spirit or scope of the present invention.

First Embodiment

Figure 1A:
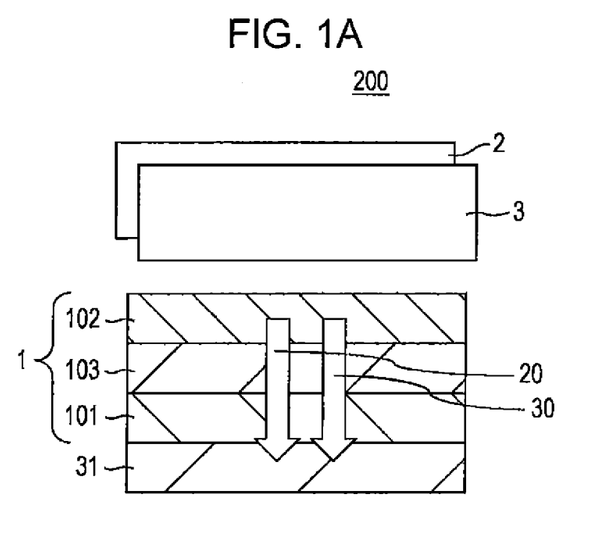
FIG. 1A is a schematic view showing a structure of a magnetization controlling element according to a first embodiment of the present invention.

In a first embodiment, a magnetization controlling element disclosed in the present invention will be described. FIG. 1A schematically shows a magnetization controlling element disclosed in the present invention. The "magnetization controlling element" is defined as an element capable of controlling the magnetization direction by means of an external field and retaining (recording) the state even after the external field is removed. A magnetization controlling element 200 includes at least three components: an ME recording layer 1 which changes magnetization using the ME effect and retains that state, a magnetic field applying mechanism 2 which applies a magnetic field to the ME recording layer 1, and an electric field applying mechanism 3 which applies an electric field to the ME recording layer 1. The arrows 20 and 30 in FIG. 1A indicate a magnetic field and an electric field applied from the magnetic field applying mechanism 2 and the electric field applying mechanism 3. As long as the magnetic field applying mechanism 2 and the electric field applying mechanism 3 have a function of substantially applying a magnetic field or an electric field to the ME recording layer 1, they may be disposed in contact with the ME recording layer 1, but can be disposed with a space therebetween on the ME recording layer 1.

The first embodiment discloses a technique in which the direction of magnetization of a magnetization controlling element is controlled by simultaneously applying a magnetic field and an electric field to the magnetization controlling element. The expression "simultaneously applying a magnetic field and an electric field" means that a state in which a magnetic field and an electric field are superimposed (superimposed region) is temporarily formed in the ME recording layer 1 constituting the magnetization controlling element, more precisely, a first ME recording layer 101 included in the ME recording layer 1. In this embodiment, "ME manipulation (magnetoelectric manipulation)" is defined as "a method of manipulating magnetization of the magnetization controlling element by applying a magnetic field and an electric field in a superimposed manner to the ME recording layer 101 so as to reverse one of the electric field and the magnetic field".

The ME recording layer 1 includes the first ME recording layer 101 containing mainly an antiferromagnetic layer having the ME effect, a second ME recording layer 102 containing mainly a ferromagnetic layer magnetically connected, through exchange coupling, to the first ME recording layer 101, a third ME recording layer 103 which is disposed between the first ME recording layer 101 and the second ME recording layer 102 and has a function of adjusting the magnitude of exchange coupling, and an electrode 31. The second ME recording layer 102 has a function for generating large magnetization necessary for transferring data of the spin array recorded in the first ME recording layer 101 and enabling operation as a device that utilizes magnetization. In the magnetization controlling element 200, as long as magnetic connection (exchange coupling) between the first ME recording layer 101 and the second ME recording layer 102 is not broken, the third ME recording layer 103 can be disposed between the first ME recording layer 101 and the second ME recording layer 102.

Figure 1B:
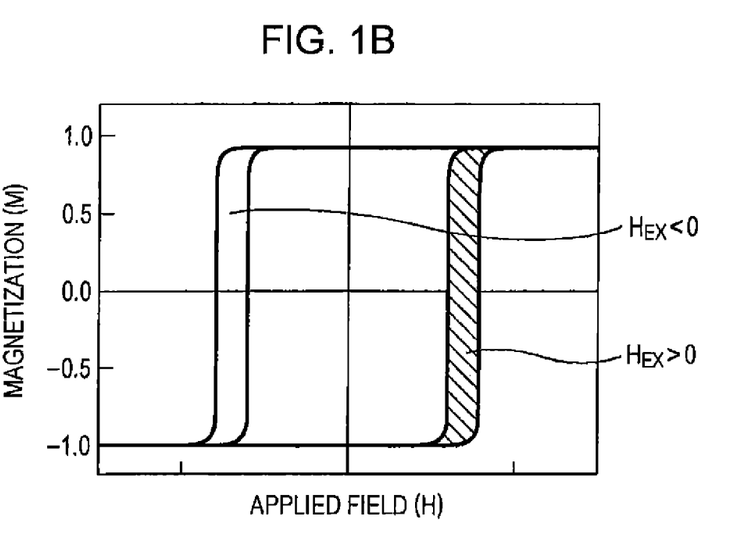
FIG. 1B is a graph showing magnetic properties of the magnetization controlling element.

FIG. 1B is a graph schematically showing the magnetization reversal phenomenon utilizing the ME effect according to the present invention. In the graph, the vertical axis indicates the normalized magnetization M, and the horizontal axis indicates the measured magnetic field H at arbitrary strength. The second ME recording layer 102 containing a ferromagnetic metal layer, which is disposed adjacent to the first ME recording layer 101 containing mainly an antiferromagnetic material, is provided with unidirectional anisotropy which is referred to as the so-called "exchange bias" from the first ME recording layer 101 through magnetic coupling. The exchange bias reflects two equivalent spin states that the antiferromagnetic material can have, and has a positive or negative value.

In the case where an electric field and a magnetic field are simultaneously applied to the antiferromagnetic material having the ME effect, it is possible to switch the direction of (positive or negative) sign of exchange bias by means of the ME effect depending on whether the relationship between the applied electric field and magnetic field is almost parallel or almost antiparallel. In this case, if the value of coercive force of the second ME recording layer 102 is smaller than the value of exchange bias provided by the first ME recording layer 101, as shown in FIG. 1B, the magnetization direction at a zero magnetic field is pinned in one direction, and the direction is switched by the sign of exchange bias.

As a consequence, the magnetization of the second ME recording layer 102 can be reversed by ME manipulation.

Second Embodiment

Figure 2A:
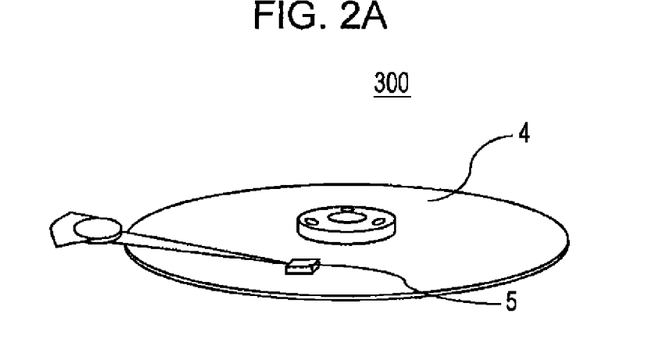
FIGS. 2A and 2B are a schematic view and a cross-sectional view, respectively, of a magnetic recording system according to a second embodiment of the present invention.

In a second embodiment, a case will be described in which a magnetization controlling element disclosed in the present invention is used as a recording medium of a magnetic recording system. FIG. 2A is a schematic view of a magnetic recording system 300 in the case where application to high-capacity magnetic recording, such as that in a hard disk, is assumed as a specific example of the second embodiment. In order to use the magnetization controlling element 200 utilizing the ME effect for a high-capacity magnetic recording medium 4, such as that a hard disk, it is required that a region in which magnetization reversal is caused by external manipulation can be restricted within a spatially limited range in the recording medium 4. For this purpose, a mechanism is necessary in which a magnetic field and an electric field to be applied are superimposed only in a spatially narrow region, and the superimposed region is moved to any given position on the recording medium 4. Head assembly technology used for hard disks can be basically used for this.

Figure 2B:
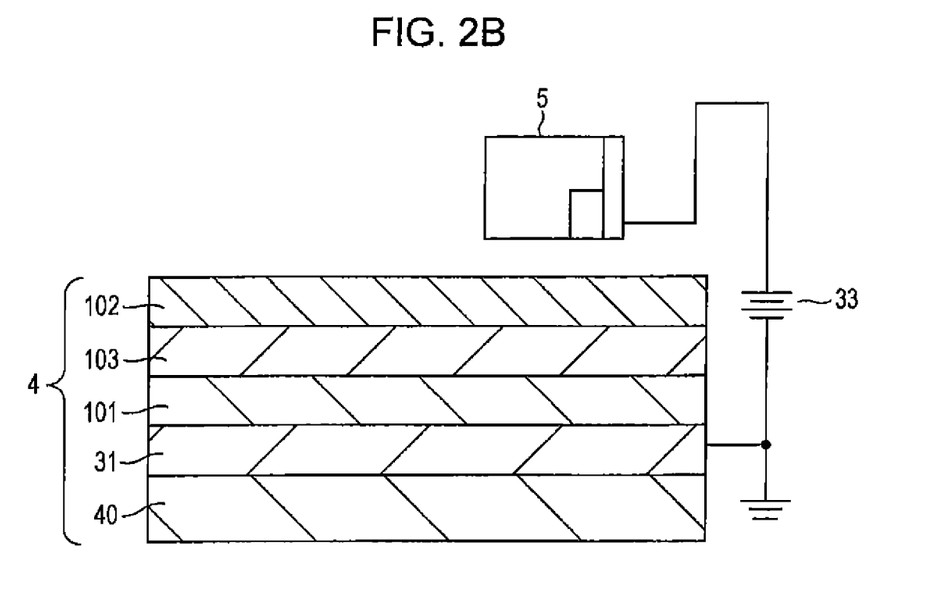

More specifically, a description will be made with reference to a cross-sectional view of FIG. 2B. An electric field and a magnetic field are supplied to a recording medium 4 from an ME recording head 5 having an electric field and magnetic field applying function. The electric field is applied from the recording head 5 in a direction toward an electrode 31 or in an opposite direction. It is difficult to restrict and apply the electric field only in a spatially narrow region in view of the structure of the recording medium 4. Accordingly, by applying the spatially limited magnetic field applied from the recording head 5 and the electric field applied between the recording head 5 and the electrode 31 simultaneously to the recording medium 4, it is possible to form a superimposed region of electric field and magnetic field at a spatially limited position on the recording medium 4. Furthermore, by arranging the recording medium 4 so that the superimposed region can be moved, for example, by appropriately switching the electric field or the magnetic field in the superimposed region while moving the recording medium 4, it is possible to continuously record magnetic data on the recording medium 4.

A significant difference of this magnetic recording system from an existing perpendicular magnetic recording system is that the recording medium 4 is applied with an electric field simultaneously with a magnetic field for recording. In order to apply an electric field from the ME recording head 5 to the recording medium 4, an electrode 31, which serves as a counter electrode of the ME recording head 5, is needed. The electrode 31 and the ME recording head are connected to a power source 33. The electrode 31 may be connected to the power source 33 only, but is preferably connected to the ground potential at the same time. The recording medium 4 includes at least five components: a first ME recording layer 101 which contains mainly an antiferromagnetic insulator having the ME effect and has a function of writing and recording magnetic data in response to superimposition of an externally applied electric field and magnetic field, a second ME recording layer 102 which is magnetically connected, through exchange coupling, to the first ME recording layer 101 and contains a metal ferromagnetic material necessary for reading magnetic data written in the first ME recording layer 101, a third ME recording layer 103 which is disposed between the first ME recording layer 101 and the second ME recording layer 102 and adjusts the magnitude of exchange coupling, an electrode 31, and a substrate 40. The second ME recording layer 102 has a function for generating large magnetization necessary for transferring and reading magnetic data recorded in the first ME recording layer 101. The third ME recording layer 103 can be disposed between the first ME recording layer 101 and the second ME recording layer 102 as long as magnetic coupling between the first ME recording layer 101 and the second ME recording layer 102 is not broken. Furthermore, the recording medium 4 may include a soft magnetic layer composed of a soft magnetic material in order to form a circuit of magnetic flux for writing, the soft magnetic layer being disposed on the substrate side of the first ME recording layer 101, the second ME recording layer 102, and the third ME recording layer 103. The soft magnetic layer and the electrode 31 may be stacked in that order on the substrate 40, or the electrode 31 and the soft magnetic layer may be stacked in that order on the substrate 40. Furthermore, in the case where a soft magnetic metal having high electric conductivity is used for the soft magnetic layer, by connecting the power source 33 to the soft magnetic layer, the soft magnetic layer can also serve as the electrode 31.

The first ME recording layer 101 has a function of writing and recording magnetic data in response to superimposition of an externally applied electric field and magnetic field. Preferable characteristics of the first ME recording layer 101 are a large magnetoelectric coupling coefficient and capability of generating a sufficiently large exchange bias in a wide temperature range. These characteristics can be obtained by using a single material having the ME effect excellent in the characteristics, and also can be obtained by using a composite material in which an antiferromagnetic material having the ME effect and another antiferromagnetic material having a higher Néel temperature are combined. In this case, thermal and temporal stability of the exchange bias exhibited between the first ME recording layer 101 and the second ME recording layer 102 tends to improve. In the composite material, the structure of the materials, the thickness of the layers, magnetic properties (anisotropic energy and Néel temperature of the antiferromagnetic material), and the like can be adjusted such that the exchange bias in a predetermined temperature range can be maximized.

The first ME recording layer 101 may have various structures. The first ME recording layer 101 may be formed of, for example, (a) a thin film including at least one of an antiferromagnetic oxide having the ME effect and a ferrimagnetic material having the ME effect, such as $Cr_2O_3$, $YMnO_3$, $BiFeO_3$, and $Ga_{1-x}Al_xFeO_3$ ($0 \leq x \leq 1$), (b) a mixed crystal whose main constituent is at least one of an antiferromagnetic oxide having the ME effect and a ferrimagnetic material having the ME effect, such as $Cr_2O_3$, $YMnO_3$, $BiFeO_3$, and $Ga_{1-x}Al_xFeO_3$ ($0 \leq x \leq 1$), or (c) a lamination structure or mixture including at least one of the antiferromagnetic oxide having the ME effect and the ferrimagnetic material having the ME effect, which are described in (a) or (b) above, and an antiferromagnetic material having a Néel temperature that is higher than that of the antiferromagnetic oxide having the ME effect. As the antiferromagnetic material, a known antiferromagnetic material having a high Néel temperature can be appropriately selected for use. Typically, an antiferromagnetic oxide, such as NiO, $Fe_2O_3$, $(1-x)Fe_2O_3$-$xRh_2O_3$, $(1-x)Fe_2O_3$-$xRuO_2$, or $(1-x)Fe_2O_3$-$xIrO_2$ (where $0<x<1$), or an antiferromagnetic metal, such as IrMn, FeMn, or PtMn, can be used. The first ME recording layer 101 may have a thickness of about 1 nm to 1 μm.

The second ME recording layer 102 has a function of generating a magnetic field for reading magnetic data written in the first ME recording layer 101. As the ferromagnetic material for the second ME recording layer 102, a hard magnetic material composed of an alloy, lamination structure, or ordered alloy having such a function can be appropriately selected for use. Typically, CoPt, FePt, and an alloy thereof are preferably used. In particular, a CoCrPt system and a CoCrPtB system can be used. In the CoCrPt system, Co—Cr—Pt (Cr content: 14 at % to 24 at %, Pt content: 8 at % to 22 at %, and the balance: Co) is preferable. In the CoCrPtB system, Co—Cr—Pt—B (Cr content: 10 at % to 24 at %, Pt content: 8 at % to 22 at %, B content: 1 at % to 16 at %, and the balance: Co) is preferable. Examples of other systems that can be used include a CoCrPtTa system, such as Co—Cr—Pt—Ta (Cr content: 10 at % to 24 at %, Pt content: 8 at % to 22 at %, Ta content: 1 at % to 5 at %, and the balance: Co), and a CoCrPtTaB system, such as Co—Cr—Pt—Ta—B (Cr content: 10 at % to 24 at %, Pt content: 8 at % to 22 at %, Ta content: 1 at % to 5 at %, B content: 1 at % to 10 at %, and the balance: Co). In addition, a CoCrPtBNd system, a CoCrPtTaNd system, a CoCrPtNb system, a CoCrPtBW system, a CoCrPtMo system, a CoCrPtCuRu system, a CoCrPtRe system, an FePtRh system, and a ferromagnetic multilayer system, such as Co/Fe, Co/Pt, or Co/Pd, may also be appropriately selected for use. The entire thickness of the second ME recording layer 102 may be about 1 to 10 nm.

For the second ME recording layer 102, any soft magnetic material may also be used. The soft magnetic material may be amorphous or microcrystalline. As the soft magnetic material used for the second ME recording layer 102, a soft magnetic material having a higher saturation magnetic flux density Bs is preferable. As the soft magnetic material, a known material exhibiting a soft magnetic property with small coercive force can be appropriately selected for use. For example, in addition to ferromagnetic metals, such as Fe and Co, a cobalt-based alloy, such as CoTaZr; a Co—Fe-based alloy, such as CoFe, CoFeB, CoCrFeB, FeCoN, FeCoV, FeCoTaZr, or CoFeZrNb; a Ni—Fe-based alloy, such as NiFe, a multilayer structure of [Ni—Fe/Sn]n, FeNiMo, FeNiCr, or FeNiSi; a Cr—Fe-based alloy, such as FeCr, FeCrTi, or FeCrCu; a Ta—Fe-based alloy, such as FeTa, FeTaC, or FeTaN; an FeAl-based alloy, such as FeAlSi, FeAl, FeAlSiCr, FeAlSiTiRu, or FeAlO; an FeMg-based alloy, such as FeMgO; an FeZr-based alloy, such as FeZrN; an FeC-based alloy; an FeN-based alloy; an FeSi-based alloy; an FeP-based alloy; an FeNb-based alloy; an FeHf-based alloy; an FeB-based alloy; MnZn; and the like may be used alone or in combination of two or more. Alternatively, a Co alloy containing 80 at % or more of Co and at least one of Zr, Nb, Ta, Cr, Mo, and the like, and having an amorphous structure may be used.

Furthermore, the second ME recording layer 102 may be a multilayer film including the hard magnetic material and the soft magnetic material, or a gradient composition film. Furthermore, the second ME recording layer 102 may be a recording layer used for a perpendicular magnetic recording medium having an exchange coupled composite (ECC) system.

The third ME recording layer 103 is disposed between the first ME recording layer 101 and the second ME recording layer 102 and has a function of adjusting the magnitude of exchange coupling. Preferable characteristics of the third ME recording layer 103 are that the magnitude of magnetic coupling between the first ME recording layer 101 and the second ME recording layer 102 can be appropriately adjusted without completely breaking the magnetic coupling, and that the coercive force ($H_C$) of the second ME recording layer 102 is not increased. A more preferable characteristic of the third ME recording layer 103 is that the coercive force (Hc) of the second ME recording layer 102 can be kept low. As the material for the third ME recording layer 103, an element having such a function can be appropriately used. From such a viewpoint, an element having a low atomic number can be suitably used as the material for the third ME recording layer 103. In general, as the atomic number increases, spin orbit interaction increases, and as a result, the value of magnetic anisotropy generated at the interface with the second ME recording layer 102 tends to increase. In particular, it has been pointed out that, in the case where Pt or Pd is used, perpendicular magnetic anisotropy generated at the interface with the second ME recording layer increases, which causes an increase in the coercive force of the second ME recording layer 102, and as a result, reversal of magnetization becomes difficult. Accordingly, as the material for the third ME recording layer 103, it is preferable to appropriately select and use a metal, an alloy, or a multilayer film thereof containing at least one element selected from the group consisting of transition metal elements excluding ferromagnetic metals, light metal elements, and semiconductor elements, whose atomic number is 45 or lower. More specifically, a metal, an alloy, or a compound containing at least one element selected from the group consisting of Ti, V, Cr, Cu, Zr, Nb, Mo, Ru, and Rh is preferably used. Alternatively, a light metal, such as Al or Mg, an alloy thereof, or a compound thereof may be used. In addition, a semiconductor element, such as Si or Ge, may be appropriately selected for use. The entire thickness of the third ME recording layer 103 may be about 0.1 to 3 nm, and more preferably 0.1 to 2 nm.

The lamination structure of the recording medium 4, specifically, the first ME recording layer 101, the second ME recording layer 102, the third ME recording layer 103, and the electrode 31 can be formed by any method appropriately selected from physical or chemical deposition processes, such as a sputtering method, a pulsed laser deposition (PLD) method, an ion-beam deposition (IBD) method, and a chemical vapor deposition (CVD) method.

As the substrate 40, a metal substrate composed of a metal material, such as aluminum or an aluminum alloy, may be used, or a non-metal substrate composed of a non-metal material, such as glass, ceramic, silicon, silicon carbide, or carbon, may be used. A glass substrate may be composed of amorphous glass or crystallized glass. As the amorphous glass, general-purpose soda-lime glass and aluminosilicate glass can be used. Furthermore, as the crystallized glass, lithium-based crystallized glass can be used. As a ceramic substrate, a sintered body mainly composed of general-purpose aluminum oxide, aluminum nitride, or silicon nitride, or a fiber-reinforced material thereof can be used. Furthermore, a NiP layer or a NiP alloy layer may be formed by a plating method or a sputtering method on the surface of the substrate.

The substrate 40 preferably has an average surface roughness Ra of 2 nm (20 Å) or less, more preferably 1 nm or less. The surface of the substrate preferably has a micro-waviness (Wa) of 0.3 nm or less (more preferably 0.25 nm or less). These numerical value ranges are preferable from the viewpoint of making the recording head fly low. Note that the micro-waviness (Wa) of the surface is a value measured using a stylus-type surface average roughness measuring instrument in a measurement range of 100 μm.

In the recording medium 4 in this embodiment, a surface protective layer and a surface lubricant layer, which are used in an existing recording medium, can be further used. The surface protective layer prevents corrosion of the second ME recording layer 102 provided on the substrate surface side and prevents damage on the surface of the medium when the recording head comes into contact with the medium. A known material can be used as the surface protective layer, and for example, a material containing C (diamond-like carbon: DLC), amorphous Si, $SiO_2$, or $ZrO_2$ can be appropriately used. From the viewpoint of high recording density, the thickness of the surface protective layer is preferably set to be 1 to 10 nm because the distance between the recording head and the recording medium can be decreased. The surface lubricant layer can be formed by applying a lubricant, such as perfluoropolyether, fluorinated alcohol, or fluorinated carboxylic acid. The surface protective layer and the surface lubricant layer are each preferably formed of a material with high resistivity and high permittivity.

Third Embodiment

Figure 3A:
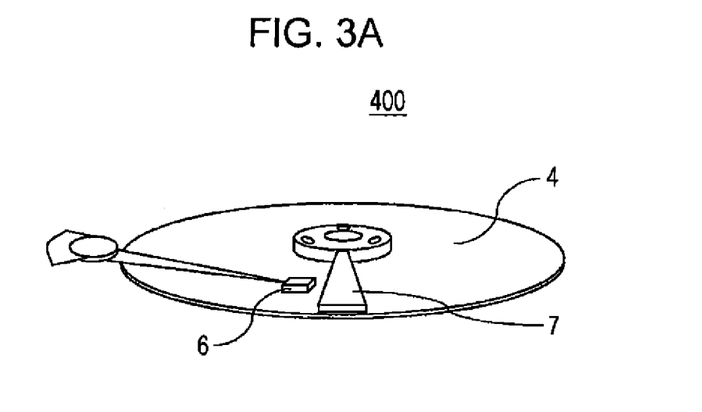
FIGS. 3A and 3B are a schematic view and a cross-sectional view, respectively, of a magnetic recording system according to a third embodiment of the present invention.

In a third embodiment, a description will be made on a magnetic recording system 400 in which an electric field and a magnetic field are not applied from a mechanism on a single recording head, but which includes, as a means for supplying an electric field more stably, a magnetic field applying mechanism 6 that has a function of applying a magnetic field and an electric field applying mechanism 7 that has a function of applying an electric field and that is disposed separately from the magnetic field applying mechanism 6. In the second embodiment, the case where the electric field applying mechanism and the magnetic field applying mechanism are configured on the same recording head has been described. However, it is not necessarily required to provide the magnetic field applying mechanism and the electric field applying mechanism on the same recording head. A structure shown in the third embodiment may be used as the means for applying a stable electric field to the first ME recording layer 101.

FIG. 3A is a schematic view of the third embodiment. A magnetic recording system according to the third embodiment is characterized in that, for the purpose of supplying an electric field stably, an electric field applying mechanism is provided separately from a magnetic field applying mechanism. Specifically, as shown in FIG. 3A, by being provided with a magnetic field applying mechanism 6 that is disposed on a head and has a function of applying a spatially limited magnetic field and an electric field applying mechanism 7 that is disposed at a position different from that of the magnetic field applying mechanism and has a function of applying an electric field to a recording medium 4, a superimposed region of the electric field and the magnetic field can be formed at a spatially limited position on the recording medium 4.

Figure 3B:
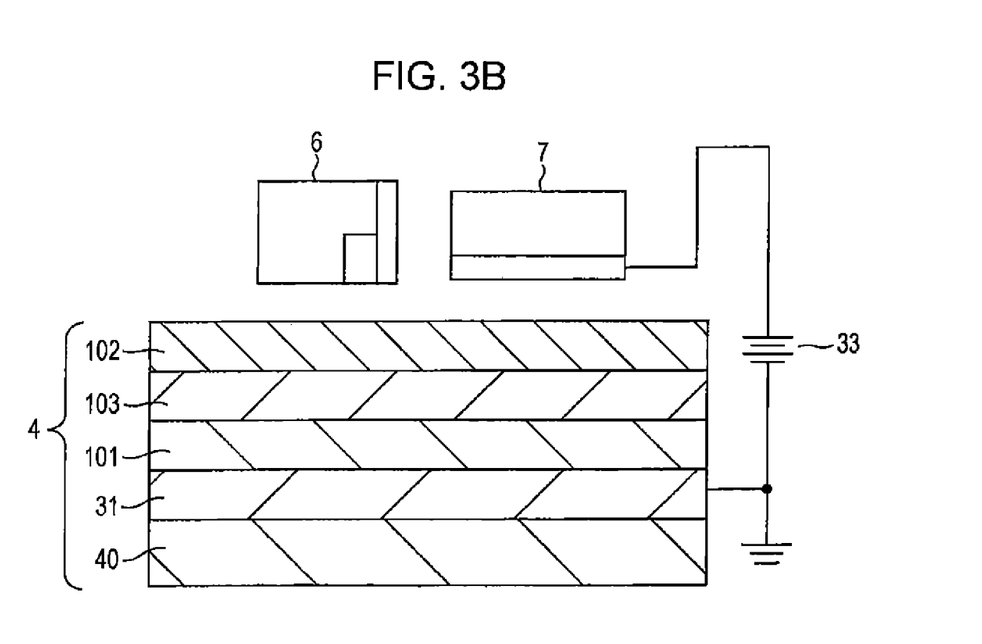

The magnetic recording system 400 according to the third embodiment includes at least three components: the recording medium 4, the magnetic field applying mechanism 6, and the electric field applying mechanism 7. In order to apply an electric field from the electric field applying mechanism 7 to the recording medium 4, an electrode 31, which serves as a counter electrode of the electric field applying mechanism 7, is needed. The electrode 31 and the electric field applying mechanism 7 are connected to a power source 33. The electrode 31 may be connected to the power source 33 only, but is preferably connected to the ground potential at the same time. The recording medium 4 includes at least five components: a first ME recording layer 101 which contains mainly an antiferromagnetic insulator having the ME effect and has a function of writing and recording magnetic data in response to superimposition of an externally applied electric field and magnetic field, a second ME recording layer 102 which is magnetically connected, through exchange coupling, to the first ME recording layer 101 and contains a metal ferromagnetic material necessary for reading magnetic data written in the first ME recording layer 101, a third ME recording layer 103 which is disposed between the first ME recording layer 101 and the second ME recording layer 102 and has a function of adjusting the magnitude of exchange coupling, an electrode 31, and a substrate 40. The second ME recording layer 102 has a function for generating large magnetization necessary for transferring and reading magnetic data recorded in the first ME recording layer 101. The third ME recording layer 103 can be disposed between the first ME recording layer 101 and the second ME recording layer 102 as long as magnetic coupling between the first ME recording layer 101 and the second ME recording layer 102 is not broken. Furthermore, the recording medium 4 may include a soft magnetic layer composed of a soft magnetic material in order to form a circuit of magnetic flux for writing, the soft magnetic layer being disposed on the substrate side of the first ME recording layer 101, the second ME recording layer 102, and the third ME recording layer 103. The soft magnetic layer and the electrode 31 may be stacked in that order on the substrate 40, or the electrode 31 and the soft magnetic layer may be stacked in that order on the substrate 40. Furthermore, in the case where a soft magnetic metal having high electric conductivity is used for the soft magnetic layer, by connecting the power source 33 to the soft magnetic layer, the soft magnetic layer can also serve as the electrode 31.

As described above, the magnetic recording system according to the present invention can be suitably used as a form known as a hard disk drive. It should be understood that the present invention can also be used for another type of data recording device, for example, a device, such as a probe recording device. It is to be noted that the present invention is not limited to the embodiments described above, and various changes can be made to the embodiments within the same and equivalent scope of the present invention.

Fourth Embodiment

Figure 4:
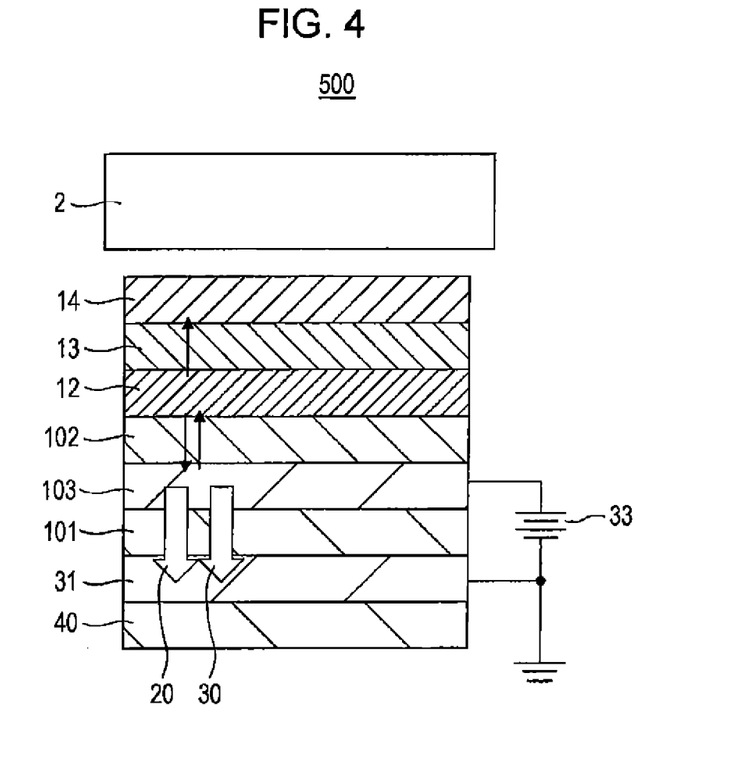
FIG. 4 is a schematic view of a magnetoresistive effect element according to a fourth embodiment of the present invention.

In a fourth embodiment, a case will be described in which a magnetization controlling element disclosed in the present invention is used as a recording layer of a magnetoresistive effect element. Such a magnetoresistive effect element can be used in a device using a magnetoresistive effect, such as an MRAM, a spin torque oscillator, or a receiver. FIG. 4 is a schematic view showing a case where a magnetization controlling element is used as a recording layer (also referred to as a "free layer" or "oscillation layer") of a magnetoresistive effect element 500 according to the fourth embodiment. The recording layer of the magnetoresistive effect element in the fourth embodiment includes at least six components: a first ME recording layer 101, a second ME recording layer 102, a third ME recording layer 103, an electrode 31, a power source 33, and a magnetic field applying mechanism 2. In order to use a magnetization controlling element using the ME effect in the magnetoresistive effect element 500, it is necessary to apply a magnetic field and an electric field in a superimposed manner over the entire first ME recording layer 101. For this purpose, it is preferable to apply an electric field directly to the first ME recording layer 101 constituting the magnetoresistive effect element 500, instead of from an electric field applying mechanism that is spatially separated. A magnetic field applying mechanism may be disposed in contact with the magnetoresistive effect element as long as it has a function of applying a magnetic field over the entire first ME recording layer, but can be disposed with a space therebetween. Existing technology, such as the giant magnetoresistive effect or the tunnel magnetoresistive effect used in MRAMs and the like can be basically used in the magnetoresistive effect generating portion.

Specifically, as shown in FIG. 4, by applying the magnetic field from the magnetic field applying mechanism 2 having a function of applying a magnetic field and the electric field applied between the electrode 31 and the third ME recording layer 103 to the first ME recording layer 101, a superimposed region of the electric field and the magnetic field can be formed over the entire first ME recording layer 101. In this case, by appropriately switching the direction of the electric field or the magnetic field in the superimposed region, the resistance value of the magnetoresistive effect element 500 can be changed.

A significant difference of this magnetoresistive effect element from an existing magnetoresistive effect element is that it is possible to switch the magnetization direction of the recording layer for causing the magnetoresistive effect between parallel and antiparallel to the magnetization direction of the pinned layer (also referred to as the "magnetic pinned layer" or "reference layer") by selecting whether the superimposition state is one where the electric field and the magnetic field are almost parallel or almost antiparallel. In particular, in the case where a fixed magnetic field (bias magnetic field) is used, only by switching the direction of the electric field, the magnetization direction of the recording layer can be reversed. In this case, a bias magnetic field can be generated by only providing a magnetic field applying mechanism using a permanent magnet. In order to apply an electric field to the first ME recording layer 101, the electrode 31, the third ME recording layer 103 serving as a counter electrode thereof, and the power source 33 connected to the electrode 31 and the third ME recording layer 103 are needed. The power source 33 may be directly connected to the third ME recording layer 103, or may be connected to the second ME recording layer 102 containing mainly a ferromagnetic metal having electric conductivity so as to supply power. The third ME recording layer 103 or the second ME recording layer 102 may be connected to the power source 33 only, but is preferably connected to the ground potential at the same time. The first ME recording layer 101 contains mainly an antiferromagnetic insulator having the ME effect and has a function of manipulating the magnetization direction of the second ME recording layer 102 or holding the state thereof in response to superimposition of an externally applied electric field and magnetic field. A change in the magnetization of the second ME recording layer 102 constituting the recording layer of the magnetoresistive effect element causes a change in the relationship between the recording layer and the pinned layer of the magnetoresistive effect element (whether the magnetic moments of the two are parallel or antiparallel), and as a result, a change in the value of magnetoresistance is obtained.

The magnetoresistive effect element 500 includes at least ten components: the electrode 31 disposed on a substrate 40, the first ME recording layer 101, the second ME recording layer 102 magnetically coupled to the ME recording layer 101, the third ME recording layer 103 which is disposed between the first ME recording layer 101 and the second ME recording layer 102 and adjusts the magnitude of exchange coupling, a non-magnetic layer 12, a ferromagnetic layer 13, an antiferromagnetic layer 14, a power source 33, and a magnetic field applying mechanism 2.

The first ME recording layer 101 may have various structures. The first ME recording layer 101 may be formed of, for example, (a) a thin film including at least one of an antiferromagnetic oxide having the ME effect and a ferrimagnetic material having the ME effect, such as $Cr_2O_3$, $YMnO_3$, $BiFeO_3$, and $Ga_{1-x}Al_xFeO_3$ ($0 \le x \le 1$), (b) a mixed crystal whose main constituent is at least one of an antiferromagnetic oxide having the ME effect and a ferrimagnetic material having the ME effect, such as $Cr_2O_3$, $YMnO_3$, $BiFeO_3$, and $Ga_{1-x}Al_xFeO_3$ ($0 \le x \le 1$), or (c) a lamination structure or mixture including at least one of the antiferromagnetic oxide having the ME effect or the ferrimagnetic material having the ME effect, which are described in (a) or (b) above, and an antiferromagnetic material having a Néel temperature that is higher than that of the antiferromagnetic oxide having the ME effect. As the antiferromagnetic material, a known antiferromagnetic material having a high Néel temperature can be appropriately selected for use. Typically, an antiferromagnetic oxide, such as NiO, $Fe_2O_3$, $(1-x)Fe_2O_3$-$xRh_2O_3$, $(1-x)Fe_2O_3$-$xRuO_2$, or $(1-x)Fe_2O_3$-$xIrO_2$ (where $0<x<1$), or an antiferromagnetic metal, such as IrMn, FeMn, or PtMn, can be used. The first ME recording layer 101 may have a thickness of about 1 nm to 1 μm.

The second ME recording layer 102 has a function of generating a magnetic moment required to produce a magnetoresistive effect as the recording layer of the magnetoresistive effect element. As the material for the second ME recording layer 102, a magnetic material composed of a ferromagnetic metal having such a function, or an alloy, lamination structure, or ordered alloy thereof can be appropriately selected for use. For example, a known soft magnetic material may be used for the second ME recording layer 102. The soft magnetic material may be amorphous or microcrystalline. As the soft magnetic material, a known material exhibiting a soft magnetic property with small coercive force can be appropriately selected for use. For example, in addition to Fe and Co, a cobalt-based alloy, such as CoTaZr; a Co—Fe-based alloy, such as CoFe, CoFeB, CoCrFeB, FeCoN, FeCoV, FeCoTaZr, or CoFeZrNb; a Ni—Fe-based alloy, such as NiFe, a multilayer structure of [Ni—Fe/Sn]n, FeNiMo, FeNiCr, or FeNiSi; a Cr—Fe-based alloy, such as FeCr, FeCrTi, or FeCrCu; a Ta—Fe-based alloy, such as FeTa, FeTaC, or FeTaN; an FeAl-based alloy, such as FeAlSi, FeAl, FeAlSiCr, FeAlSiTiRu, or FeAlO; an FeMg-based alloy, such as FeMgO; an FeZr-based alloy, such as FeZrN; an FeC-based alloy; an FeN-based alloy; an FeSi-based alloy; an FeP-based alloy; an FeNb-based alloy; an FeHf-based alloy; an FeB-based alloy; MnZn; and the like may be used alone or in combination of two or more. Alternatively, a Co alloy containing 80 at % or more of Co and at least one of Zr, Nb, Ta, Cr, Mo, and the like, and having an amorphous structure may be used. Furthermore, CoPt, FePt, and other alloys may be preferably used. In particular, a CoCrPt system and a CoCrPtB system can also be used. In addition, a ferromagnetic multilayer system, such as Co/Fe, Co/Pt, or Co/Pd, may also be appropriately selected for use.

The third ME recording layer 103 is disposed between the first ME recording layer 101 and the second ME recording layer 102 and has a function of adjusting the magnitude of exchange coupling. Preferable characteristics of the third ME recording layer 103 are that the magnitude of magnetic coupling between the first ME recording layer 101 and the second ME recording layer 102 can be appropriately adjusted without completely breaking the magnetic coupling, and that the coercive force ($H_C$) of the second ME recording layer 102 is not increased. A more preferable characteristic of the third ME recording layer 103 is that the coercive force (Hc) of the second ME recording layer 102 can be kept lower. As the material for the third ME recording layer 103, an element having such a function can be appropriately used. From such a viewpoint, as the material for the third ME recording layer 103, it is preferable to appropriately select and use a metal, an alloy, or a multilayer film thereof containing at least one element selected from the group consisting of transition metal elements excluding ferromagnetic metals, light metal elements, and semiconductor elements, whose atomic number is 45 or lower. More specifically, a metal, an alloy, or a compound containing at least one element selected from the group consisting of Ti, V, Cr, Cu, Zr, Nb, Ma, Ru, and Rh is preferably used. Alternatively, a light metal, such as Al or Mg, an alloy thereof, or a compound thereof may be used. In addition, a semiconductor element, such as Si or Ge, may be appropriately selected for use. The entire thickness of the third ME recording layer 103 may be about 0.1 to 3 nm, and more preferably 0.1 to 2 nm.

When the magnetoresistive effect element 500 is fabricated so as to have a bottom-pinned-type structure, the antiferromagnetic layer 14 and the ferromagnetic layer 13 constituting a pinned layer are disposed on the substrate 40 side. When the magnetoresistive effect element 500 is fabricated so as to have a top-pinned-type structure, the antiferromagnetic layer 14 and the ferromagnetic layer 13 constituting a pinned layer are disposed on a side opposite to the substrate 40, and the electrode 31 is disposed on the substrate side.

A case where the magnetoresistive effect element 500 has a top-pinned-type structure will be described. In this case, the magnetoresistive effect element 500, for example, has a lamination structure including eight components: substrate 40/electrode 31/first ME recording layer 101/third ME recording layer 103/second ME recording layer 102/non-magnetic layer 12/ferromagnetic layer 13/antiferromagnetic layer 14, which are stacked in that order. Preferably, the second ME recording layer 102 has magnetic anisotropy in a direction perpendicular to the film surface, and the easy magnetization direction thereof is perpendicular to the film surface. Note that the magnetization direction of each of the ferromagnetic layer 13 and the second ME recording layer 102 may be parallel to the film surface. The magnetization direction of the ferromagnetic layer 13 is invariable (pinned). The magnetization direction of the second ME recording layer 102 is variable (can be reversed). For example, the ferromagnetic layer 13 is provided with unidirectional anisotropy from the antiferromagnetic layer 14.

The antiferromagnetic layer 14 is, for example, composed of an antiferromagnetic metal, such as IrMn or PtMn.

The ferromagnetic layer 13 may be composed of a single ferromagnetic material, or, for example, may have a synthetic anti-ferromagnetic (SAF) structure in which two ferromagnetic layers sandwiching a non-magnetic layer are magnetically exchange-coupled. In this case, the non-magnetic layer is, for example, composed of Ru, and the ferromagnetic layers are, for example, composed of CoFe or CoFeB.

In the case where, for example, TMR is used as the magnetoresistive effect element, the non-magnetic layer 12 is composed of $AlO_x$, MgO, $Mg_xAl_2O_4$, or the like, and serves as a tunnel barrier layer. In the case where, for example, GMR is used as the magnetoresistive effect element, the non-magnetic layer 12 is composed of a non-magnetic metal, such as Ru or Cu.

The lamination structure is subjected to patterning, for example, by photolithography and RIE. As a result, for example, a magnetoresistive effect element 500 whose planar shape is rectangular or elliptical is formed.

As described above, the magnetoresistive effect element according to the present invention can be suitably used in the known form of TMR or GMR. It is to be understood that the present invention is also applicable to another type of magnetoresistive effect element, for example, a nano-contact-type magnetoresistive effect element or the like. The present invention is not limited to the embodiments described above, and various changes can be made to the embodiments within the same and equivalent scope of the present invention.

EXAMPLES

The present invention will be described below on the basis of specific examples. The following description merely describes embodiments in which the advantageous effects of the present invention are confirmed by the examples, and the present invention is not limited to the embodiments. It is to be noted that, as long as embodiments of products embody the technical idea of the present invention, such products are within the scope of the present invention.

Figure 5:
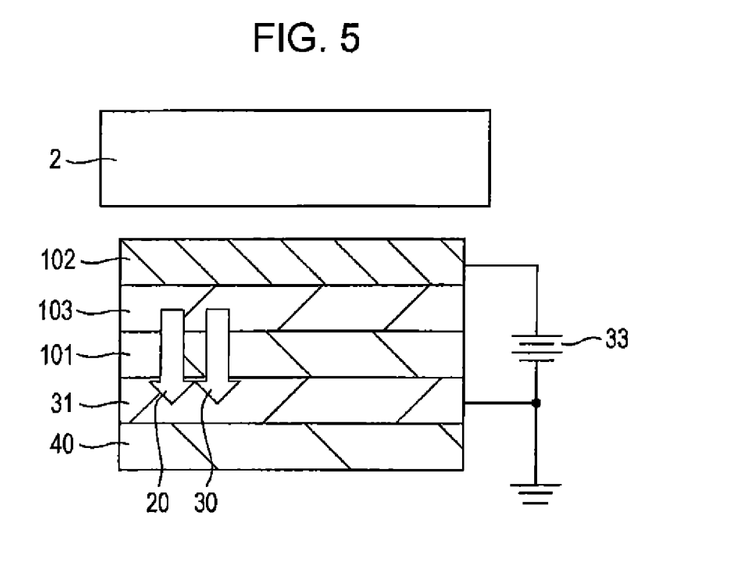
FIG. 5 is a view showing a structure of a sample simulating a magnetization controlling element according to Example 1 of the present invention.

In Examples 1 to 3, samples simulating a magnetization controlling element 200 such as the one shown in FIG. 5 were fabricated, and the effects thereof were confirmed.

A detail thereof will be described with reference to FIG. 5. A substrate 40 is a sapphire substrate, an electrode 31 is composed of Pt, a first ME recording layer 101 is an antiferromagnetic oxide layer having the ME effect composed of $Cr_2O_3$, a second ME recording layer 102 is a ferromagnetic metal layer composed of Co, and a third ME recording layer 103 is an exchange coupling adjustment layer, for example, composed of metallic Ru or metallic Cr. A cap layer composed of Pt is disposed on the second ME recording layer 102 mainly for the purpose of preventing natural oxidation of the ferromagnetic layer. The second ME recording layer 102 and the electrode 31 are connected to a power source 33, and a positive or negative electric field can be applied perpendicular to the sample. A magnetic field applying mechanism composed of an electromagnet for applying a magnetic field is provided vertically to the sample, which is a known technique and the description of which will be omitted. The electrode 31, the first, second, and third ME recording layers 101, 102, and 103 may be formed using any physical or chemical deposition process, such as a sputtering method, a pulsed laser deposition (PLD) method, an ion-beam deposition (IBD) method, or a chemical vapor deposition (CVD) method.

Sample 1

The fabrication method for Sample 1 will be described below. A Pt electrode 31 with a thickness of 25 nm is formed by an rf sputtering method on a c-plane sapphire substrate with a step/terrace structure.

On the surface of the Pt layer, a $Cr_2O_3$ (001) layer with a thickness of 250 nm is formed by a reactive rf sputtering method using a metallic Cr target at 500° C., at 0.3 Pa, under an argon-oxygen atmosphere (flow ratio $Ar:O_2=9.0:0.9$), and at a plasma power of 100 W. A first ME recording layer 101 is formed of the $Cr_2O_3$ layer.

Next, third ME recording layers 103 composed of a metallic Ru with various thicknesses of 0.25 to 2 nm and a second ME recording layer 102 composed of a ferromagnetic metallic Co layer with a thickness of 1 nm are formed by a dc sputtering method at 135° C. under an argon atmosphere. A protective layer composed of metallic Pt with a thickness of 5 nm is further formed on the second ME recording layer 102.

Sample 2

Sample 2 was fabricated as in Sample 1 except that metallic Cr was used instead of Ru for the third ME recording layer 103.

Samples 3 to 10

Sample 3 was fabricated in order to confirm magnetization reversal by the ME effect. In Sample 3, the first ME recording layer 101 has a thickness of 500 nm, and the third ME recording layer 103 is composed of metallic Cr with a thickness of 0.25 nm. Furthermore, in Sample 3, in order to electrically observe the magnetization direction of the second ME recording layer 102 by means of the anomalous Hall effect (AHE), the second ME recording layer 102, the third ME recording layer 103, and the cap layer are formed in a cross-shaped Hall bar pattern. For comparison, samples having the same structure as that of Sample 3, but in which transition metal elements Ti, Cu, and Ru were used for the third ME recording layer 103 (Samples 4 to 6), a light metal element: Al was used (Sample 7), a semiconductor element: Si was used (Sample 8), metallic Pt was used instead of the third ME recording layer 103 (Sample 9), and no third ME recording layer 103 was used (Sample 10), were fabricated.

Example 1

Exchange Coupling Adjustment Effect by Third ME Recording Layer 103

Figure 6:
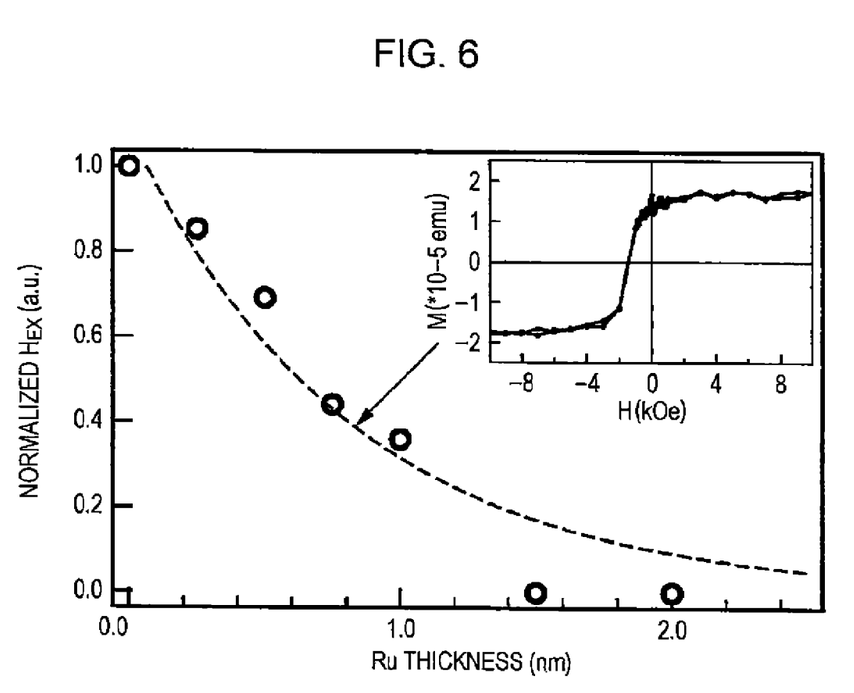
FIG. 6 is a graph showing the relationship between the strength of exchange coupling and the thickness of a third ME recording layer 103 in sample 1 according to Example 1 of the present invention. The inset shows magnetic properties in the case where the thickness of the Ru layer is 0.75 nm.

Using Sample 1, the effect of the third ME recording layer 103 serving as the exchange coupling adjustment layer was confirmed. FIG. 6 shows the result of Sample 1 in which the third ME recording layer 103 is composed of metallic Ru. By measuring magnetic properties of Sample 1 using a superconducting quantum interference device (SQUID) while changing the thickness of the metallic Ru layer, the change in the magnitude of exchange coupling and the change in the magnitude of coercive force were checked. The thickness of the metallic Ru layer was changed to 0.25, 0.5, 0.75, 1.0, 1.5, and 2.0 nm. In the graph of FIG. 6, the strength of exchange coupling at 100K is plotted on the vertical axis, and the thickness of the metallic Ru layer is plotted on the horizontal axis. Note that the strength value of exchange coupling shown in the graph is a relative value to the value of exchange coupling in the absence of a third ME recording layer 103. The value of exchange coupling is maximum when no third ME recording layer 103 is present, decreases with the increasing thickness of the metallic Ru layer, and is substantially zero at 1.5 and 2 nm. The inset in the graph shows an MH loop of Sample 1 when the thickness of the third ME recording layer 103 is 0.75 nm. It has been confirmed that the coercive force is kept sufficiently low compared with the exchange coupling. Furthermore, it has been confirmed that the coercive force is about 600 Oe in the case where no third ME recording layer 103 is present at the same temperature, while the coercive force is kept low at 200 Oe or less in all the samples provided with the metallic Ru layer.

Example 2

Exchange Coupling Adjustment Effect 2 by Third ME Recording Layer 103

Figure 7A:
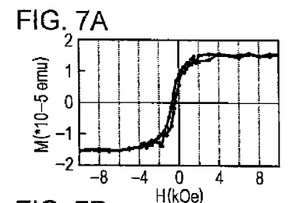
FIGS. 7A to 7G are graphs showing magnetic properties of samples according to Example 2 of the present invention (A: 10K, B: 50K, C: 100K, D: 150K, E: 200K, F: 250K, G: 300K).
Figure 7B:
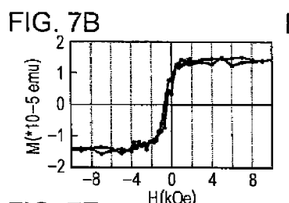
Figure 7C:
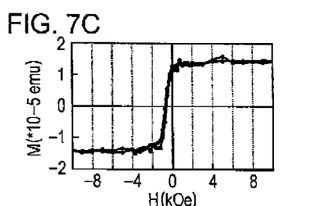
Figure 7D:
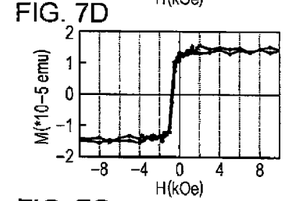
Figure 7E:
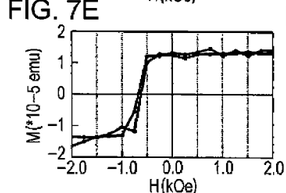
Figure 7F:
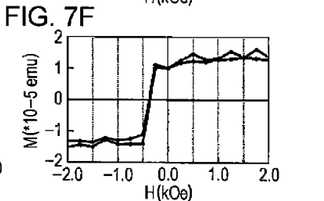
Figure 7G:
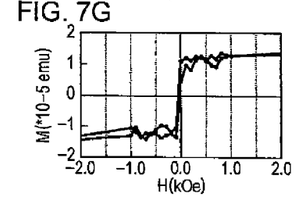
Figure 7H:
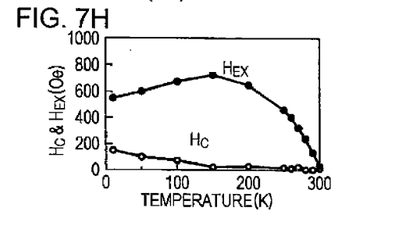
FIG. 7H is a graph in which the magnitude of exchange bias ($H_{EX}$) and the magnitude of coercive force ($H_C$) of samples according to Example 2 of the present invention are plotted relative to the measured temperature.

Using Sample 2, the effect was confirmed in the case where the third ME recording layer 103 was composed of metallic Cr. FIGS. 7A to 7G show changes in the MH loop when magnetic properties of Sample 2 with a Cr thickness of 0.5 nm were measured using a SQUID at different temperatures. FIG. 7H is a graph in which, on the basis of the above results, the value of exchange coupling and the value of coercive force are plotted on the vertical axis, and the measured temperature is plotted on the horizontal axis. It has been confirmed from FIG. 7H that at all measured temperatures, the value of exchange coupling exceeds the value of coercive force, and the value of coercive force is kept low at 200 Oe or less over the entire temperature range.

Example 3

Magnetization Reversal by Me Recording Manipulation

Figure 8:
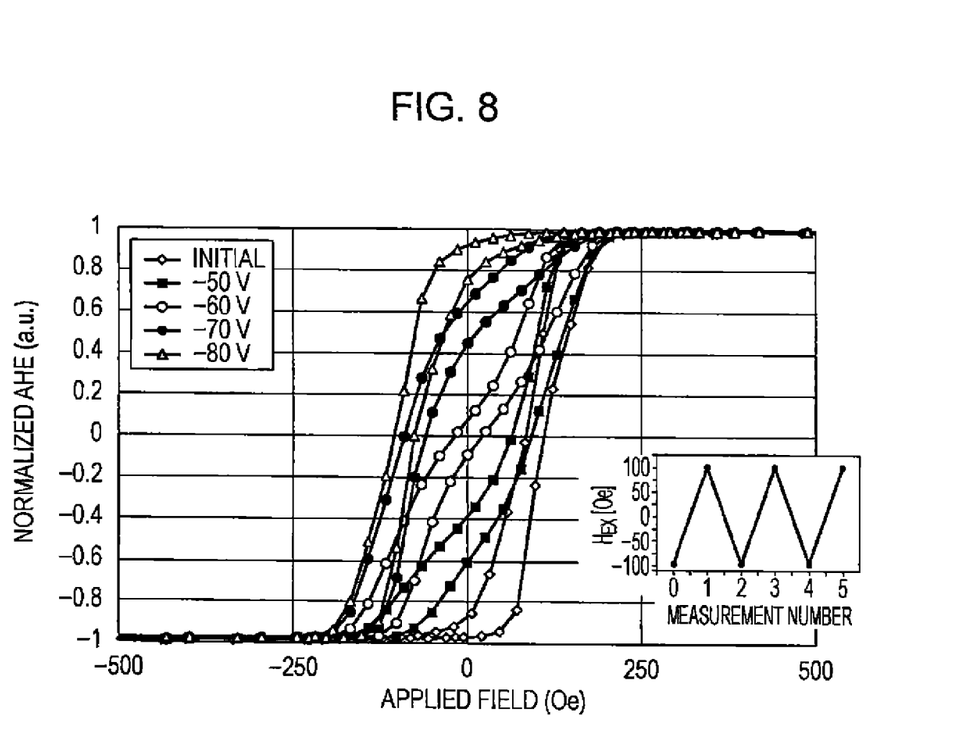
FIG. 8 is a graph showing changes in magnetic properties when the applied voltage to samples according to Example 3 of the present invention is changed. The inset shows the repeat characteristic.

Using Sample 3, the effect of magnetization reversal by ME manipulation was actually confirmed. FIG. 8 is a graph showing changes in magnetization measured by measuring the anomalous Hall effect (AHE) in the case where the value of applied electric field is changed with a fixed magnetic field of 6,000 Oe being applied to Sample 3. The vertical axis of the graph indicates the signal of normalized AHE, which is proportional to the amount of magnetization. From the loop in the initial state, it can be confirmed that the value of exchange coupling exceeds the coercive force, and the value of coercive force is kept very low at several tens of oersted (Oe). It has been confirmed that, when an electric field is applied at an applied voltage (V) of −50 V, the magnetization direction gradually changes from the initial state, and at an applied voltage (V) of −80 V, the magnetization direction changes to a completely opposite state. This means that magnetization is completely reversed by ME manipulation. The inset shows the results of repeated measurement. Measurement was performed by switching the direction of an electric field by applying alternately at an applied voltage (V) of +100 V and −100 V. As a result, it has been confirmed that reciprocation between two states is possible.

Table 1 shows the relationship between the rate of magnetization reversal and dielectric breakdown when ME manipulation is performed in Sample 3, Samples 4 to 6 in which transition metal elements (Ti, Cu, and Ru) are used for the third ME recording layer 103, Sample 7 in which a light metal element (Al) is used, Sample 8 in which a semiconductor element (Si) is used, Sample 9 in which Pt is used instead of the third ME recording layer 103, and Sample 10 without a third ME recording layer 103. The rate of magnetization reversal defines the ratio of change from the initial state in FIG. 8, in which the case where complete reversal occurs as in the state after application of −80 V is set at 100%. For example, in the case of −60 V in FIG. 8, the rate of magnetization reversal is about 50%. In the case where the applied voltage is increased, and the loop changes at the time occurrence of dielectric breakdown, the rate of change at that time is considered as the rate of magnetization reversal. In the case where dielectric breakdown occurs before the change, the rate of magnetization reversal is 0%. In the samples in which a third ME recording layer 103 is not present or Pt is used, which have been reported in the related art, in order to obtain the relationship: exchange coupling>coercive force, the value of exchange coupling must be increased, and the product of electric field and magnetic field required for manipulation increases. As a result, even when a voltage that breaks down the element is applied, substantially no change is obtained. In contrast, in the elements disclosed by the present invention, the magnitude of exchange coupling can be appropriately adjusted while keeping the relationship: exchange coupling>coercive force, and therefore, an electric field can be applied without breaking down the element. Consequently, as is evident from Table 1, the magnetization direction can be stably manipulated by the ME manipulation.

TABLE 1

|  | MAXIMUM RATE OF MAGNETIZATION REVERSAL | INSULATING PROPERTY |
| --- | --- | --- |
| SAMPLE 3 (Cr) | 100% | OK |
| SAMPLE 4 (Ti) | 100% | OK |
| SAMPLE 5 (Cu) | 100% | OK |
| SAMPLE 6 (Ru) | 100% | OK |
| SAMPLE 7 (Al) | 100% | OK |
| SAMPLE 8 (Si) | 100% | OK |
| SAMPLE 9 (Pt) | 10% | BREAKDOWN |
| SAMPLE 10 (W/O INTERLAYER) | 0% | BREAKDOWN |

Although the present invention has been described on the basis of the examples, it is obvious to a person skilled in the art that various alterations and modifications are possible without departing from the scope of the present invention which is set forth in the appended claims.

What is claimed is:
1. A magnetization controlling element comprising:
a ferromagnetic material layer;
an exchange coupling adjustment layer;
an antiferromagnetic material layer;
an electrode layer;
a magnetic field applying mechanism; and
an electric field applying mechanism,
wherein the ferromagnetic material layer, the exchange coupling adjustment layer, the antiferromagnetic material layer, and the electrode layer are disposed in that order from the ferromagnetic material layer side,
the magnetic field applying mechanism applies a magnetic field to the antiferromagnetic material layer,
the electric field applying mechanism applies an electric field to the antiferromagnetic material layer,
the antiferromagnetic material layer is an insulator and contains an antiferromagnetic material or ferrimagnetic material having a magnetoelectric effect,
the ferromagnetic material layer includes a ferromagnetic material layer that is magnetically connected, through exchange coupling, to the antiferromagnetic material layer, the exchange coupling adjustment layer has a function of adjusting exchange coupling between the ferromagnetic material layer and the antiferromagnetic material layer, and the exchange coupling adjustment layer has a thickness of from 0.25 nm to 1.0 nm and contains at least one element selected from the group consisting of transition metal elements excluding ferromagnetic metals, light metal elements, and semiconductor elements, whose atomic number is 45 or lower.

2. The magnetization controlling element according to claim 1, wherein the exchange coupling adjustment layer contains a transition metal element whose atomic number is 45 or lower excluding ferromagnetic metals, and the transition metal element includes at least one element of Ti, V, Cr, Cu, Zr, Nb, Mo, Ru, and Rh.

3. The magnetization controlling element according to claim 1, wherein the exchange coupling adjustment layer contains a light metal element whose atomic number is 45 or lower, and the light metal element includes at least one element of Mg and Al.

4. The magnetization controlling element according to claim 1, wherein the exchange coupling adjustment layer contains a semiconductor element whose atomic number is 45 or lower, and the semiconductor element includes at least one element of Si and Ge.

5. The magnetization controlling element according to claim 1, wherein the ferromagnetic material layer includes a perpendicular magnetization film having a magnetization component perpendicular to the film surface.

* * * * *